United States Patent [19]

Ohta et al.

[11] Patent Number: 4,531,148
[45] Date of Patent: Jul. 23, 1985

[54] HIGH SENSITIVITY FM SIGNAL DEMODULATION SYSTEM

[75] Inventors: Tomozo Ohta; Yoshio Tsutsumi; Motoshi Sugano, all of Tokyo, Japan

[73] Assignee: OKI Electric Industry Co., Ltd., Tokyo, Japan

[21] Appl. No.: 474,677

[22] PCT Filed: Aug. 31, 1981

[86] PCT No.: PCT/JP81/00206
§ 371 Date: Feb. 18, 1983
§ 102(e) Date: Feb. 18, 1983

[87] PCT Pub. No.: WO83/00973
PCT Pub. Date: Mar. 17, 1983

[51] Int. Cl.³ .................... H04N 9/535; H04N 9/50
[52] U.S. Cl. .................... 358/21 R; 358/23; 455/340; 329/136
[58] Field of Search ............ 358/23, 1, 21 R, 191.1; 455/340, 195, 214, 266; 329/136, 139, 140

[56] References Cited

U.S. PATENT DOCUMENTS 4,101,837 7/1978 Clayton, Jr. et al. .......... 329/136 X
4,127,825 11/1978 Blomley ..................... 358/23 X Primary Examiner—John C. Martin
Assistant Examiner—Michael Dunnam
Attorney, Agent, or Firm—Martin M. Novack

[57] ABSTRACT

The present invention relates to the improved demodulation system which improves the noise characteristics for the demodulation of a wideband television FM signal. A variable bandpass filter (8), the center frequency and the bandwidth of which are controllable, for improving C/N, is inserted at the output of a reference bandpass filter (7) in an FM signal path. The bandwidth of the variable bandpass filter (8) is controlled so that said bandwidth is wide when the input carrier level is high, and said bandwidth is narrow when the input carrier level is low. The center frequency of the variable bandwidth filter (8) is controlled so that said center frequency follows to the instantaneous frequency of the color sub-carrier component (3.58 MHz). Said color sub-carrier component is derived by a narrow-band bandpass filter (10) coupled with the output of said discriminator (9) for controlling the center frequency of the variable bandpass filter (8).

10 Claims, 11 Drawing Figures

HIGH SENSITIVITY FM SIGNAL DEMODULATION SYSTEM

This application claims priority from International Application No. PCT/JP81/00206, filed Aug. 31, 1981.

FIELD OF THE INVENTION

The present invention relates to a high sensitivity demodulation system which improves the noise characteristics of a wideband television (picture) signal—an FM modulation signal, with low input level, by using a simple structure.

BACKGROUND OF THE INVENTION

A prior simple demodulation system for a frequency demodulation signal is a discriminator system using an L and a C circuit, or a delay line. In this case, the signal-to-noise ratio S/N of the demodulated signal for the C/N of the FM modulated input signal (C/N is the ratio of the carrier signal power to the noise power) is expressed:

$$S/N = C/N \; FI$$

where FI is a constant. Thus, the value S/N of the demodulated signal is proportional to the C/N of the input signal.

On the other hand, the value C/N depends upon the bandwidth of a bandpass filter, which is provided at the input side of a demodulator for restricting the bandwidth of both the noise power and the signal power. Generally, that equation is satisfied when the value C/N is higher than 10 dB, and when the value C/N is less than that value, the value S/N is rapidly deteriorated. That value of C/N (=10 dB) is called a threshold level.

An FM system is utilized for transmitting a television (picture) signal, for instance through a satellite relay system. In this case, the receive level at a receive side is near the threshold level because of the restriction of the transmission power of a satellite, the stability of the transmission path, and/or the cost of the reception equipment at an earth station. Accordingly, an input signal level is decreased by the change of the condition of the transmission path, and that level sometimes becomes lower than the threshold level. Then, the demodulated picture signal on a television screen is deteriorated considerably by an impulse noise which is peculiar to an FM transmission system. And sometimes no demodulated picture signal is obtained.

Accordingly, it is important to improve the characteristics for that impulse noise for improving a television picture and/or reducing the cost of reception equipment, in particular, it is very important to improve the noise characteristics when a direct broadcasting satellite communication system is utilized.

Many systems have been proposed for improving the threshold level. One of them is a dynamic tracking system (see PROC IEE vol.115, No.11, November 1968, pages 1597-1606) as shown in FIG. 1. The reference numeral 1 is a narrow band variable bandpass filter the center frequency of which is controllable, 2 is a limiter, 3 is a frequency discriminator, 4 is a lowpass filter, 5 is a signal input terminal, 6 is an output terminal of the demodulated signal. The FM signal at the input terminal 5 passes the variable bandpass filter 1, the limiter 2, and is demodulated by the discriminator 3. The demodulated signal controls the center frequency of the variable bandpass filter 1 through the lowpass filter 4 which removes the high frequency component noise. The center frequency of the variable bandpass filter 1 follows completely to the instantaneous frequency change of the input signal at the input terminal 5. That is to say, the amplitude component and the phase component of the output of the discriminator is fedback completely to control the center frequency of the variable bandpass filter.

Next, the demodulation of an FM signal of a color television signal is described. A color picture signal has an intensity signal and a color sub-carrier signal, and the total bandwidth of the color picture signal is even 4.2 MHz. Further, the frequency spectrum of a color picture signal depends considerably upon the picture, in particular, the amplitude of the color sub-carrier component depends upon the saturation factor of a color of a picture.

Due to the nature of a color picture signal, a conventional FM signal demodulation system of FIG. 1 has some disadvantages. First, it is almost impossible to feedback the amplitude and the phase of the output of the discriminator through the feedback circuit having an amplifier, a lowpass filter to the variable bandpass filter, stably and following completely to the instantaneous frequency change of the input FM signal, since a television signal has a very wide bandwidth.

If the feedback signal is not complete, an FM signal with a large deviation can not pass the variable bandpass filter, and then, the demodulated waveform is distorted. When the value C/N and/or S/N is low, that waveform distortion is not critical. The higher the value C/N is, the more critical the waveform distortion is. Therefore, when the value C/N is high, a simple discriminator having a fixed bandwidth provides better picture quality than the circuit of FIG. 1 does.

Further, when the frequency deviation is large, and the high modulation frequency component is not completely fedback, that component having the large FM deviation power is removed by the variable bandpass filter, thus, the value C/N is deteriorated, and the value C/N becomes less than the threshold level. Thus, the presence of a variable bandpass filter provides the undesirable effect.

Even when the feedback circuit functions correctly, the input signal does not effectively pass the variable bandpass filter due to the feedback of the wideband noise component. As a result, this noise deteriorates the demodulated picture signal. In particular, when the signal level is rather low, the demodulated picture signal is much affected by the wideband. For instance, when the saturation of the color signal is low, the wideband noise is demodulated, and that demodulated noise deteriorates the picture on the screen by generating the visible color noise.

SUMMARY OF THE INVENTION

The object of the present invention is to overcome the disadvantages of a prior system, and to improve the noise characteristics of an FM signal modulated with a picture signal in particular when the value C/N is low, by utilizing the particular nature of a color picture signal.

According to the present invention, a variable bandpass filter in which the center frequency and the bandwidth are controllable, and a reference bandpass filter with the fixed bandwidth are inserted in series in a signal circuit, and, the demodulated signal which is the output of the discriminator provides the color sub-carrier component for controlling the center frequency of said variable bandpass filter. Further, a level detector or a C/N detector for detecting the level of the input signal is provided, and when the input signal has the value C/N higher than the predetermined value, the variable bandpass filter has enough bandwidth so that the bandwidth of the receive signal is substantially restricted merely by the reference bandpass filter. When the value C/N is equal to or lower than the predetermined value, the bandwidth of the variable bandpass filter is narrowed, and the center frequency of the variable bandpass filter follows to the instantaneous frequency of the demodulated color sub-carrier component of the FM signal. The bandwidth of the variable bandpass filter is narrowed stepwise or continuously according to the value C/N, which is determined according to the input signal level and the bandwidth of the reference bandpass filter. Preferably, a non-linear circuit which provides the non-linear relation between the input signal and the output signal of the same, is inserted in the feedback loop of the color sub-carrier component so that when the level of the demodulated color sub-carrier component is low, the low feedback level is provided, and when that color sub-carrier level is high, the high feedback level is provided. That non-linear circuit improves the noise characteristics of the demodulation system.

PREFERRED EMBODIMENTS OF THE INVENTION

Figure 1:
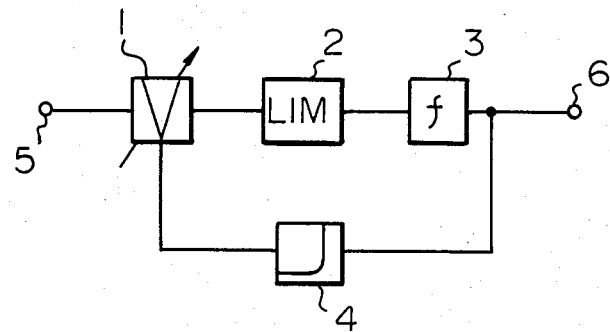
FIG. 1 is a block diagram of a prior demodulation system.
Figure 2:
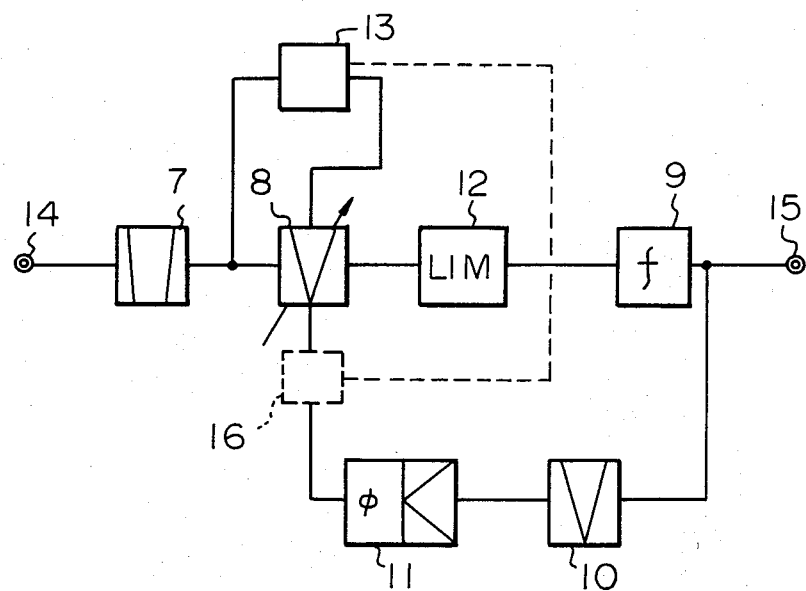
FIG. 2 is a block diagram of the demodulation system according to the present invention.

FIG. 2 shows the block diagram of the embodiment of the present invention. In the figure, the reference numeral 7 is a reference bandpass filter having the fixed bandwidth, 8 is a variable bandpass filter in which both the center frequency and the bandwidth are separately controllable by respective external control signals, 9 is a conventional frequency discriminator which has inductance L, capacitance C, or a delay line, 10 is a narrow bandpass filter for deriving the color sub-carrier component of 3.58 MHz, 11 is an adjuster of level and phase having an amplifier and a phase shifter (the gain and the phase-shift by the adjuster 11 are fixed when other circuit portions are adjusted), 12 is a limiter, 13 is a level detector for detecting the input signal level, or a C/N (ratio of carrier level to noise level) detector, 14 is an input terminal of an input FM signal, 15 is an output terminal of the demodulated picture signal, 16 is a switching circuit for switching the 3.58 MHz component, and said switching circuit 16 is optionally inserted in the circuit.

The input FM signal at the input terminal 14 is applied to the discriminator 9 which demodulates the input FM signal, through the reference bandpass filter 7, the variable bandpass filter 8 in which the center frequency and the bandwidth are independently controllable, and the limiter 12. The bandpass filter 10 derives the color sub-carrier component of 3.58 MHz, which controls the center frequency of the variable bandpass filter 8 through the adjuster 11. On the other hand, the level detector 13 (or C/N detector) measures the level at the output of the reference bandpass filter 7, and the signal relating to the input signal level is applied to the variable bandpass filter 8 for controlling the bandwidth of that variable bandpass filter 8. The output of the level detector 13 is optionally applied to the switching circuit 16 in the feedback loop of the color sub-carrier component for switching on and off the feedback circuit.

In the above configuration, the input signal level which depends upon the bandwidth $B_0$ of the reference bandpass filter 7 is detected by the level detector 13.

When the detected level or the value C/N is higher than the threshold level, that is to say, when the value C/N is higher than about 10 dB, the bandwidth of the variable bandpass filter 8 is controlled to be wider than the bandwidth $B_0$ of the reference bandpass filter 7, by the control of the level detector 13. At the same time, when the switching circuit 16 is installed, that switching circuit 16 is opened. Accordingly, in this situation (when the signal level is higher than the threshold level), the bandwidth of the input signal applied to the discriminator 9 is equal to $B_0$ which is the bandwidth of the reference bandpass filter.

On the other hand, when the input signal level is equal to or lower than the threshold level, which depends upon the bandwidth $B_0$ of the reference bandpass filter 7, the output of the level detector 13 controls the bandwidth of the variable bandpass filter 8 either continuously or stepwise so that said bandwidth becomes narrower. And, the switching circuit 16 in the feedback loop is closed and the center frequency of the variable bandpass filter 8 is controlled so that said center frequency follows to the instantaneous frequency change of the color sub-carrier component of the FM signal. The FM signal which passes the variable bandpass filter 8 is demodulated by the frequency discriminator 9 through the limiter 12. And, the demodulated signal is applied to the output terminal 15. The color sub-carrier component in the demodulated signal is derived by the bandpass filter 10, and the derived color sub-carrier component controls the center frequency of the variable bandpass filter 8 so that the center frequency of the variable bandpass filter 8 follows to the frequency change of the color sub-carrier component in the input FM signal. Accordingly, the level and the phase of the color sub-carrier component are adjusted by the adjuster 11 so that the center frequency of the variable bandpass filter 8 follows to the instantaneous frequency change of the color sub-carrier component of the FM signal. Thus, the value C/N at the output of the variable bandpass filter is improved, and the threshold level for the input signal is also improved. The theoretical effect of the improvement of the threshold level is described later.

By the way, in a conventional frequency discriminator, the bandwidth $B_0$ of the signal is usually determined to be:

$$B_0 = 2(\Delta F + f_h)$$

so that the most power of the modulation signal can pass and the waveform of the demodulated signal is kept good. In the above equation $\Delta f$ is the peak frequency deviation of an input FM signal, $f_h$ is the highest freqeuncy of the modulation signal. The actual bandwidth is usually a little wider than said value $B_0$ considering the frequency fluctuation of a carrier signal.

The ratio C/N at the input of the discriminator in the above condition is improved to $C_i/kB_0$, where k is a constant.

If the variable bandpass filter 8 were deleted, or the bandwidth of the variable bandpass filter 8 is wider than the bandwidth $B_0$ of the reference bandpass filter 7 in FIG. 2, the circuit of FIG. 2 functions similar to a conventional FM demodulator.

Figure 3:
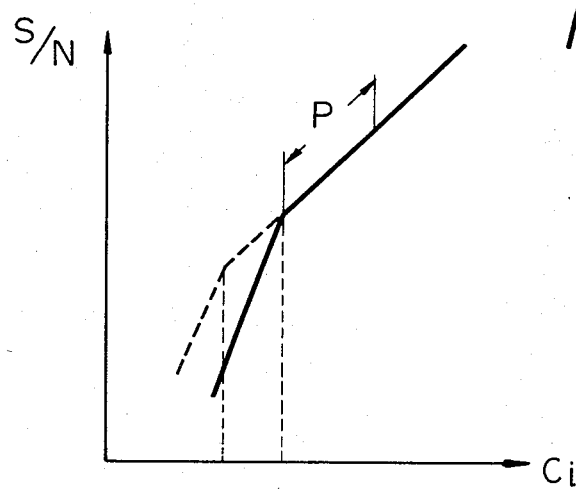
FIG. 3, FIG. 4, FIG. 5, FIG. 6, FIG. 7, and FIG. 8 are explanatory drawings of the operation of the apparatus of FIG. 2.

FIG. 3 shows the curve between the input carrier signal level (horizontal axis) and the signal-to-noise ratio (S/N) (vertical axis) of the demodulated signal by the discriminator 9. In a normal condition, the input carrier signal level is higher than the threshold level $C_t$ by several dB, and said carrier level is in the region P of FIG. 3. In that region P, the value S/N of the demodulated signal is:

$$S/N = (3/2)(\Delta f/f_h)^2(B_0/f_h)(C_i/N)$$

where $N = kB_0$.

When the input signal level (C/N) is higher than threshold level, the picture quality of an FM signal depends upon the thermal noise, the non-linearity of the amplitude and/or the phase characteristics of the transmission circuit, and the bandwidth $B_0$ of the demodulator. When the bandwidth $B_0$ is narrow, the thermal noise is reduced, but the waveform distortion is increased. Therefore, if the bandwidth is too narrow, even the modulation signal itself is removed, and then, the value C/N is decreased, and the thermal noise is increased.

In a conventional demodulation circuit which has the bandwidth $B_0 = 2(\Delta f + f_h)$, when the input carrier level is close to the threshold level, the picture quality depends mainly upon the threshold noise (impulse noise), but the effect of the amplitude and/or phase distortion of the circuit is masked by the effect of said thermal noise. When the input carrier level is lower than the threshold level, the picture quality is rapidly deteriorated due to the decrease of the input carrier level, and a picture is masked almost completely by an impulse noise, and the discrimination or the demodulation of a picture becomes almost impossible. Accordingly, the picture quality is substantially determined by said impulse noise, and therefore, the picture quality can be improved by decreasing said impulse noise although the waveform distortion due to the amplitude and/or phase distortion of the circuit increases a little.

One of the features of the present invention is to narrow the bandwidth of the signal to improve the value C/N as the value C/N is lowered close to the threshold level. However, if the bandwidth of the signal is narrowed without the deep consideration, even the signal component is removed by the bandpass filter when the frequency deviation of the input signal is large, and therefore, the decrease of the carrier and noise level causes the deterioration of the C/N value.

Accordingly, the present invention adjusts the center frequency of the variable bandpass filter so that said center frequency follows to the instantaneous frequency change of the color sub-carrier component of the FM signal which takes the pre-emphasis in a transmit side. It should be appreciated that the color sub-carrier component with the pre-emphasis takes the highest frequency deviation in the modulated color picture signals. With this configuration, the implementation of the circuit becomes possible and simple.

Now, the picture signal with an emphasis system is considered.

Generally, a color picture signal includes an intensity signal and a color signal, and includes the frequency spectrum up to 4.2 MHz. In those spectrums, an intensity signal distributes in the low frequency area which is the multiple of the horizontal scan frequency (15.75 KHz), and a color signal distributes around 3.58 MHz. When that picture signal is processed by a pre-emphases circuit (for instance, CCIR Rec. 405-1 standard pre-emphasis), the low frequency portion is weighted about $-10$ dB, and the high frequency portion is weighted about $+3$ dB.

The standard color bar signal which has the highest saturation level in the picture signal, has the maximum amplitude 140 IRE of the total signal, the maximum amplitude 77 IRE of the intensity signal, and the maximum amplitude 88 IRE of the color sub-carrier component (3.58 MHz). Accordingly, when that signal is processed by the pre-emphasis circuit, the amplitude of the color sub-carrier component is 127 IRE, which is close to the maximum amplitude 140 IRE of the original signal. Accordingly, it is the color sub-carrier component that has the maximum frequency deviation, and effects much to the value C/N by using a narrow bandpass filter, in a pre-emphasized picture signal. Therefore, the present invention controls the center frequency of the variable bandpass filter following to the color sub-carrier component of the FM signal so that the input FM signal is transmitted effectively to the discriminator and the input noise is reduced to improve the ratio C/N.

It should be appreciated that said color sub-carrier component feedback loop processes almost a single frequency (3.58 MHz), and therefore, a simple circuit may control both the amplitude and the phase of that color sub-carrier component (3.58 MHz).

Next, the improvement of the ratio C/N by the variable bandpass filter is described.

Figure 4:
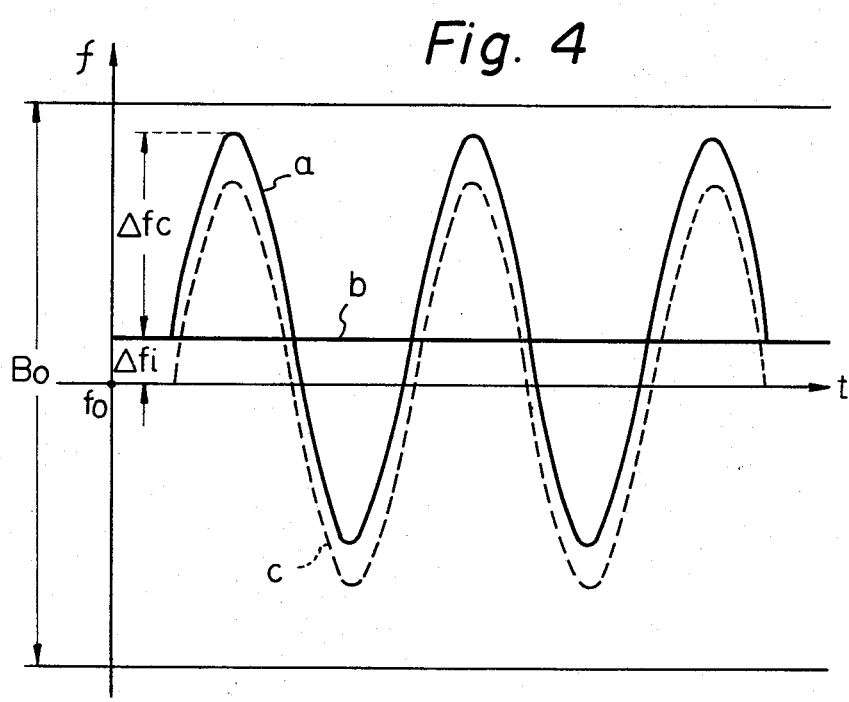

FIG. 4 shows the instantaneous frequency change of an FM signal which passed the reference bandpass filter 7 having the bandwidth $B_0$ (solid line curves (a) and (b)), and the instantaneous change of the center frequency of the variable bandpass filter 8 (dotted line curve (c)). In FIG. 4, $f_0$ is the reference center frequency of the variable bandpass filter when no control is accomplished by the color sub-carrier component. It is assumed for the simplicity of the explanation that the instantaneous frequency change is composed of the frequency change (a) of the color sub-carrier component, and the frequency change (b) of the intensity signal. Each frequency deviation is $\Delta f_c$ and $\Delta f_i$ respectively and the ratio of $\Delta f_c/\Delta f_i$ is large. The center frequency (dotted line (c)) of the variable bandpass filter follows to the instantaneous frequency change (curve (a)), and the frequency deviation of the same is equal to $\Delta f_c$.

Figure 5:
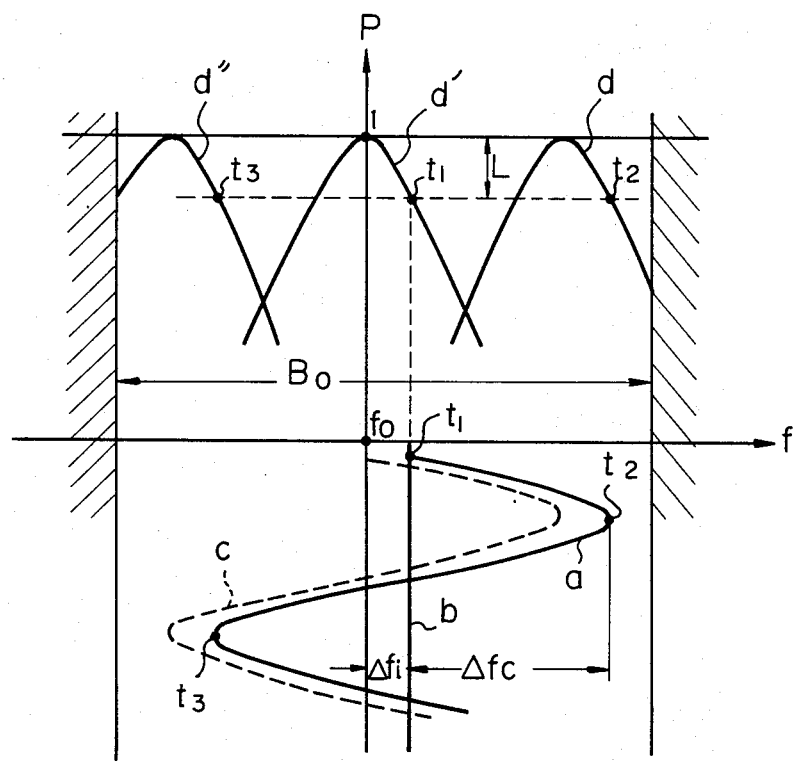

FIG. 5 shows the curves between the frequency f (horizontal axis) and the output power P (vertical axis) of the variable bandpass filter 8. In the figure, the solid line curves (a), (b) and dotted line curve (c) show the same characteristics as those of FIG. 4, and the curves (d), (d') and (d") show some examples of the bandpass characteristics of the variable bandpass filter 8.

In FIG. 5, when the instantaneous frequency is $t_1$ ($=f_0+\Delta f_i$), the center frequency of the variable bandpass filter is $f_0$, and when the instantaneous frequency changes to $t_2$ ($=f_0+\Delta f_i+\Delta f_c$), the center frequency changes to $f_0+\Delta f_c$.

Therefore, the frequency difference $\Delta f_i$ is provided between the center frequency of the variable bandpass filter and the instantaneous signal frequency. Therefore, the signal power is decreased by L in the variable bandpass filter.

When the variable bandpass filter is composed of a single resonator, the transfer function is shown by the equation (1).

$$T(f)=1/(1+(2\Delta f/b_0)^2) \tag{1}$$

where $\Delta f$ is the frequency difference from the center frequency of the filter, and $b_0$ is the 3 dB bandwidth.

When the signal power is normalized to unit 1, and the noise power density is 1/Hz at the input of the variable bandpass filter 8, the noise power when the bandwidth is $B_0$ which is equal to the bandwidth of the reference bandpass filter is $B_0$, and the value $C_i/N_i$ of the input signal is $1/B_0$. Since the signal frequency is apart from the center of the bandpass filter by $\Delta f_i$, the signal output of the bandpass filter is:

$$C_0=1/(1+(2\Delta f_i/b_0)^2)$$

The noise power which passes the bandpass filter is not constant, since the center frequency of the variable bandpass filter changes in the bandwidth $B_0$ as shown by the curves (d), (d') and (d") in FIG. 5. That noise power which passes the bandpass filter is the maximum when the center frequency of the bandpass filter is at the center $f_0$ of the bandwidth $B_0$, and the value C/N at the output of the bandpass filter is minimum at that time. The noise power at that time is given by the following equation.

$$N_0 = 2 \int_0^{\frac{B_0}{2}} \frac{1}{1+(2f/b_0)^2} df = b_0 \tan^{-1}(B_0/b_0) \tag{2}$$

Accordingly, the value C/N ($=C_0/N_0$) at the output of the filter is:

$$C_0/N_0=[(1+(2\Delta f_i/b_0)^2)b_0 \tan^{-1}(B_0/b_0)]^{-1}$$

Then, the improvement ($\eta=(C_0/N_0)/(C_i/N_i)$) of the value C/N by the use of the variable bandpass filter is:

$$\eta = \frac{C_0/N_0}{C_i/N_i} \tag{3}$$

$$= [(1 + (2\Delta f_i/b_0)^2(b_0/B_0)\tan^{-1}(B_0/b_0)]^{-1}$$

In an actual satellite relay communication system, a picture signal having the bandwidth 4.2 MHz is transmitted with the frequency deviation up to 10.75 MHz, and the emphasis characteristics recommended by CCIR 405-1 is applied. The bandwidth of a demodulator in that case is 30 MHz.

Figure 6:
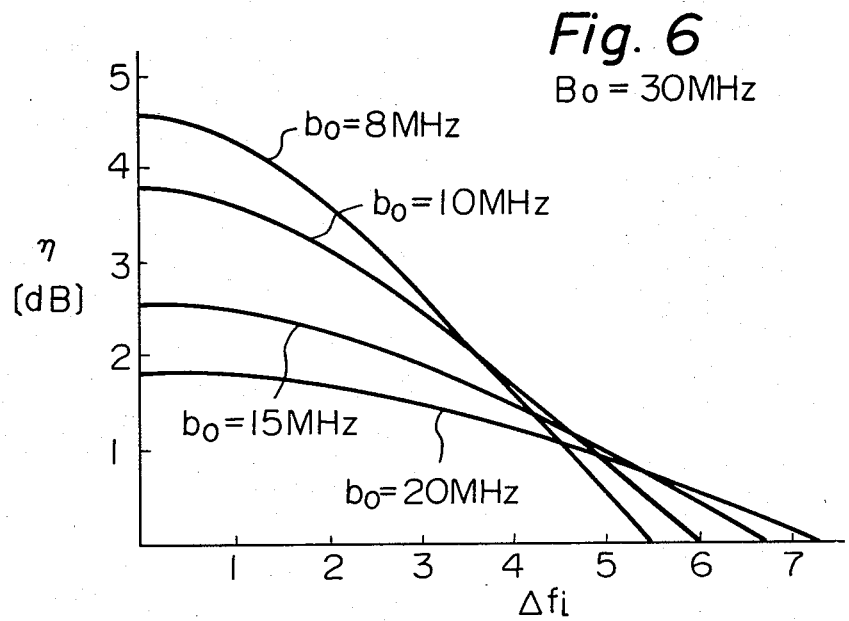

On the other hand, when the present invention is utilized for that picture signal, the improvement shown by the equation (3) by using the present invention is shown in FIG. 6.

In FIG. 6, $b_0$ is the 3 dB bandwidth of the variable bandpass filter, and $\Delta f_i$ is the frequency deviation of an intensity signal at the output of the pre-emphasis circuit in a transmit side. The improvement ($\eta$) in FIG. 6 shows the minimum value as described before, and it should be appreciated that the larger improvement is obtained when the smaller the value $\Delta f_i$ is.

Figure 7:
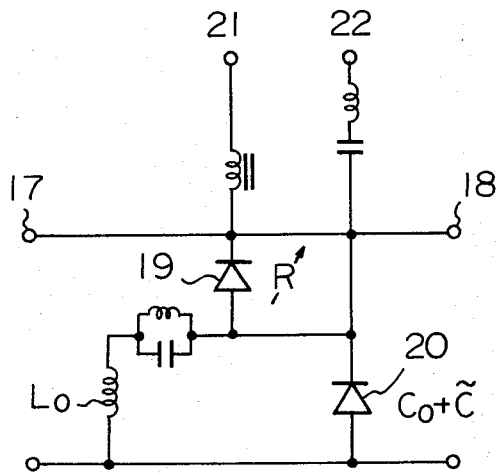

FIG. 7 shows a parallel resonant circuit for the use of a variable bandpass filter. In the figure, the reference numeral 17 and 18 are an input terminal and an output terminal, respectively, of the variable bandpass filter, 19 is a variable resistance element which is implemented for instance by the forward resistance of a diode, 20 is a variable capacitance element which is also implemented by a diode, 21 is an input terminal coupled with the level detector 13 of FIG. 2, 22 is an input terminal of the 3.58 MHz color sub-carrier component which is supplied by the frequency discriminator. A series resonant circuit, a parallel resonant circuit, and a choke coil are coupled with some input terminals so that control signals at the input terminals are applied to the filter without interference. The inductance $L_0$ and the capacitance $C_0$ (which is the basic capacitance of the variable capacitor 20) are designed so that the center frequency $f_0$ of the input FM signal resonants with the resonant circuit of $L_0$ and $C_0$.

With the above configuration, when the value C/N of the input signal is large, the resistance R of the variable resistance element 19 is high according to the input signal at the input terminal 21, and therefore, the input FM signal at the terminal 17 is passed to the output terminal 18 without restricting the bandwidth. When the value C/N of the input FM signal is reduced, the resistance of the variable resistance element 19 has the low resistance, and then, the parallel resonant circuit composed of the inductance $L_0$ and the capacitance $C_0$ is inserted in the FM signal path. Therefore, the circuit of FIG. 7 functions as a bandpass filter to restrict the bandwidth of the input FM signal. If the control signal is applied to the input terminal 22 which receives the color sub-carrier signal, the capacitance of the variable capacitor 20 changes according to that control signal, and therefore, the resonant frequency of the resonant circuit of $L_0$ and $C_0$ is controlled. As a result, the center frequency of the variable bandpass filter of FIG. 7 changes, and the desired bandpass characteristics are obtained.

Figure 8:
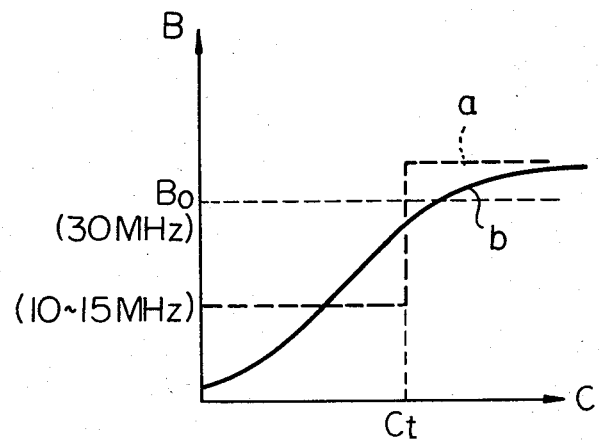

FIG. 8 shows the curve of the bandwidth of the variable bandpass filter 8. The dotted line curve (a) in FIG. 8 shows the characteristics in which the bandwidth changes stepwise when the carrier level C is near the threshold level $C_t$ which is defined by the bandwidth $B_0$ of the reference bandpass filter. The solid line curve (b) in FIG. 8 shows the characteristics in which the bandwidth changes continuously according to the change of the input carrier level C.

Since the sudden change of the bandwidth might deteriorate the picture quality, the curve (b) which changes continuously is preferable.

The degree of the change of the bandwidth of the variable bandpass filter for each input signal level is determined according to the characteristics of the filter and the level detector (or the C/N detector), taking into consideration of the relationship between the input signal level and the picture quality. That level detector may use the control voltage of an AGC amplifier in a conventional receiver equipment.

As described above, the present invention uses the nature of a color television signal when the input signal level is equal to or lower than the threshold level, and the nature of the same with the pre-emphasis process. In the above embodiment, a reference bandpass filter, and a variable bandpass filter are connected in cascade form, and the center frequency and the bandwidth of the latter are controllable separately. The center frequency of the variable bandpass filter is controlled by the color sub-carrier component which is obtained in the demodulated signal in the discriminator, and the bandwidth of the variable bandpass filter is controlled by the input carrier level (C/N).

When the input C/N level is high, the bandwidth of the variable bandpass filter is wide and therefore, the bandwidth of the input signal is defined by the bandwidth of the reference bandpass filter, and then, an excellent demodulated waveform is obtained. When the input level is decreased less than the predetermined C/N level, the bandwidth of the variable bandpass filter is narrowed, and the center frequency of the same follows to the frequency change of the color sub-carrier component of the input FM signal. Since the variable bandpass filter is controlled by the narrow bandwidth signal, the circuit does not respond to an undesired noise component which is not fedback to the variable bandpass filter, and therefore, the input signal would effectively pass the variable bandpass filter due to the feedback of narrow bandwidth without noise component. Therefore, the present invention is superior to a conventional demodulation system which has wideband feedback circuit in the circuit configuration, and the obtained noise characteristics of the demodulated picture signal of the present invention is excellent. In particular, the present invention is advantageous when the frequency deviation of the intensity signal ($\Delta f_i$) is small. The present invention has many advantages as described above, and some of them are that the improvement of C/N of the input carrier, or the improvement of the threshold level, and the noise in a demodulated picture signal is reduced, and a picture quality is considerably improved.

Figure 9:
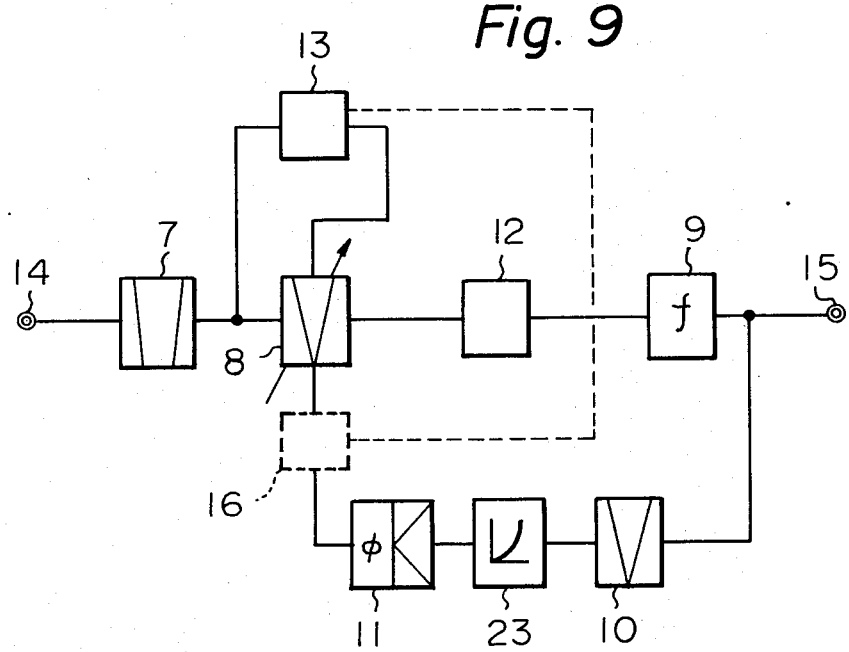
FIG. 9 is a block diagram of another embodiment of the present demodulation system.
Figure 10:
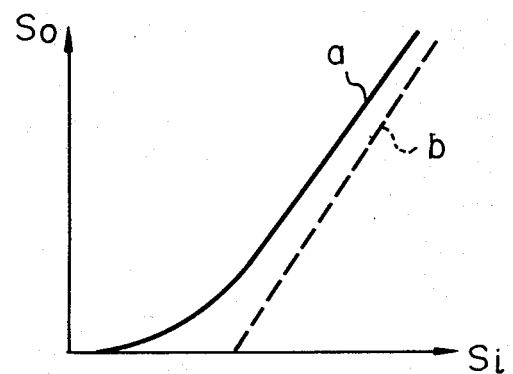
FIG. 10 is the explanatory drawing of the non-linear circuit of FIG. 9.

FIG. 9 shows the second embodiment of the present invention. The feature of FIG. 9 is the presence of a non-linear circuit 23 inserted in the control circuit of the color sub-carrier circuit. The non-linear circuit 23 has the characteristics that the ratio ($S_0/S_i$) of the output level to the input level of the same depends upon the input signal level $S_i$. Other portions of FIG. 9 are the same as those of FIG. 2. Said non-linear circuit is implemented by using the combination of non-linear resistance components, and has the characteristics as shown by the curve (a) or (b) of FIG. 10. As shown in FIG. 10, when the input signal level $S_i$ is low, the ratio $S_0/S_i$ is small, and when the level $S_i$ is high, the ratio $S_0/S_i$ is also high.

It should be noted in the previous embodiment of FIG. 2 that the color sub-carrier component which is derived by the bandpass filter 10 has some noise component which is within the passband of said bandpass filter 10. Therefore, when the level of the color sub-carier component is low, that is to say, when the saturation of the color signal is low, or a picture is close to a monochrome picture, said noise component is amplified by the amplifier of the adjuster 11, the output of which disturbs the stable operation of the variable bandpass filter 8. Therefore, the feedback by this noise component would increase the color noise and deteriorate the picture quality.

Accordingly, in the embodiment of FIG. 9, the non-linear circuit 23 is inserted in the feedback circuit so that when the level of the color sub-carrier component is low, the control signal to the variable bandpass filter 8 is decreased also to prevent the variable bandpass filter disturbed by the noise component. Thus, the deterioration of a picture quality by color noise is prevented.

Figure 11:
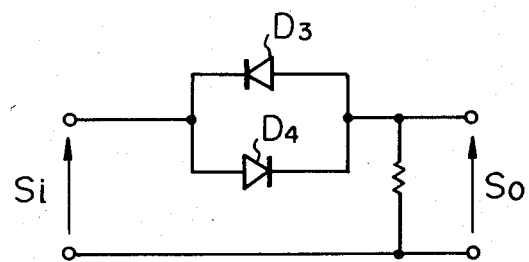
FIG. 11 is a circuit diagram of a non-linear circuit.

FIG. 11 is a circuit diagram of the non-linear circuit 23, having a pair of diodes $D_3$ and $D_4$ coupled in parallel with the opposite polarities.

APPLICATION TO INDUSTRIES

The present invention is implemented simply by using a variable bandpass filter, a reference filter, a color sub-carrier component control circuit, and a frequency discriminator, and improves the ratio S/N of the demodulated signal at the particular input signal level, and improves the picture quality. Accordingly, the present invention is utilized in a receiver in a satellite communication system in which input signal level of a picture signal modulated in an FM system is very low.

We claim:

1. A high sensitivity FM signal demodulation system comprising:

an input terminal (14) for receiving a television FM signal, a reference bandpass filter (7) having the predetermined bandwidth, coupled with said input terminal (14), a variable bandpass filter (8) coupled with the output of said reference bandpass filter (7), the center frequency and the bandwidth of said variable bandpass filter being controllable, a limiter circuit (12) and a frequency discriminator (9) coupled with the output of said variable bandpass filter, an output terminal (15) coupled with the output of said frequency discriminator, a narrow bandwidth bandpass filter (10) for deriving a color sub-carrier component of a picture signal, coupled with the output of said frequency discriminator, a color sub-carrier adjuster (11) coupled with the output of said frequency discriminator for providing a signal related to the instantaneous frequency of the sub-carrier for controlling the center frequency of said variable bandpass filter (8), a level detector (13) for measuring the input signal level of said variable bandpass filter (8) to control the bandwidth of said variable bandpass filter (8) according to the measured input signal level, the bandwidth of said variable bandpass filter (8) being controlled to be wide by the output of said level detector (13) when the input level of said television FM signal is higher than a threshold level (C/N) so that the bandwidth of the signal and the noise applied to the limiter circuit (12) and the frequency discriminator (9) is determined by the bandwidth of the reference bandpass filter (7), and said bandwidth of said variable bandpass filter (8) being controlled so as to be narrow as said television FM signal level decreases, and the center frequency of said variable bandpass filter (8) being controlled by the output of said adjuster (11) so that said center frequency follows to the instantaneous frequency of said color sub-carrier component of the input FM signal, and a signal demodulated by said frequency discriminator (9) being applied to said output terminal (15).

2. A high sensitivity FM signal demodulation system according to claim 1, wherein said variable bandpass filter (8) comprises a parallel resonant circuit with a fixed inductance element of the inductance $L_0$ and a variable capacitance element (20), and the capacitance of said variable capacitance element (20) is controlled by said color sub-carrier component.

3. A high sensitivity FM signal demodulation system according to claim 2, wherein said parallel resonant circuit is coupled with a signal path through a diode (19), and the bandwidth of said variable bandpass filter (8) is adjusted by adjusting the resistance of the diode according to the output of the level detector (13).

4. A high sensitivity FM signal demodulation system according to claim 1, wherein a switch circuit (16) is provided at the output circuit of the adjuster (11) so that the control of the center frequency of the variable bandpass filter (8) is accomplished only when the bandwidth of said variable bandpass filter is narrow.

5. A high sensitivity FM signal demodulation system according to claim 1, wherein the bandwidth of the variable bandpass filter (8) is about 30 MHz when the carrier to noise ratio C/N is higher than 10 dB, and said bandwidth is about 15 MHz when the ratio C/N is equal to or less than 10 dB.

6. A high sensitivity FM signal demodulation system comprising:

an input terminal (14) for receiving a television FM signal, a reference bandpass filter (7) having a predetermined bandwidth, coupled with said input terminal, a variable bandpass filter (8) coupled with the output of said reference bandpass filter, the center frequency and the bandwidth of said variable bandpass filter being controllable, a limiter circuit (12) and a frequency discriminator (9) coupled with the output of said variable bandpass filter, an output terminal (15) coupled with the output of said frequency discriminator, a narrow bandwidth bandpass filter (10) for deriving a color sub-carrier component of a picture signal, coupled with the output of said frequency discriminator, a non-linear circuit (23) for adjusting the level of said color sub-carrier component non-linearly, a color sub-carrier adjuster (11) coupled with the output of said non-linear circuit (23) for controlling the center frequency of said variable bandpass filter (8), a level detector (13) for measuring the input signal level of said variable bandpass filter (8) to control the bandwidth of said variable bandpass filter (8) according to the measured input signal level, the bandwidth of said variable bandpass filter (8) being controlled so as to be wide by the output of said level detector (13) when the input level of said television FM signal is higher than a threshold level (C/N) so that the bandwidth of the signal, the noise applied to the limiter and the frequency discriminator are determined by the bandwidth of the reference bandpass filter, and as said television FM signal level decreases, said bandwidth of said variable bandpass filter (8) being controlled to be narrow and the center frequency of said variable bandpass filter (8) being controlled by the output of said adjuster (11), so that said center frequency follows the instantaneous frequency of said color sub-carrier component of the input FM signal, and a signal demodulated by said frequency discriminator (9) being applied to said output terminal (15).

7. A high sensitivity FM signal demodulation system according to claim 6, wherein said variable bandpass filter (8) comprises a parallel resonant circuit with a fixed inductance element of the inductance $L_0$ and a variable capacitance element (20), and the capacitance of said variable capacitance element (20) is controlled by said color sub-carrier component.

8. A high sensitivity FM signal demodulation system according to claim 7, wherein said parallel resonant circuit is coupled with a signal path through a diode (19), and the bandwidth of said variable bandpass filter (8) is adjusted by adjusting the resistance of the diode according to the output of the level detector (13).

9. A high sensitivity FM signal demodulation circuit according to claim 6, wherein a switch circuit (16) is provided at the output circuit of the adjuster (11) so that the control of the center frequency of the variable bandpass filter (8) is accomplished only when the bandwidth of said variable bandpass filter is narrow.

10. A high sensitivity FM signal demodulation system according to claim 6, wherein the bandwidth of the variable bandpass filter (8) is about 30 MHz when the carrier level to noise level ratio C/N is higher than 10 dB, and said bandwidth is about 15 MHz when the ratio C/N is equal to or less than 10 dB.

* * * * *